(12) United States Patent
Chen et al.

(10) Patent No.: US 7,453,734 B2
(45) Date of Patent: Nov. 18, 2008

(54) METHOD AND APPARATUS FOR FAST PROGRAMMING OF MEMORY

(75) Inventors: Chung-Kuang Chen, Taipei (TW); Yi-Te Shih, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/555,620

(22) Filed: Nov. 1, 2006

(65) Prior Publication Data

US 2008/0112232 A1    May 15, 2008

(51) Int. Cl.
*G11C 16/04* (2006.01)
(52) U.S. Cl. .......................... 365/185.28; 365/185.11; 365/185.12; 365/185.22
(58) Field of Classification Search ............ 365/185.11, 365/185.12, 185.22, 185.28
See application file for complete search history.

(56) References Cited

U.S. PATENT DOCUMENTS

| 6,046,940 | A  | * | 4/2000  | Takeuchi et al. | ....... 365/185.17 |
| 6,134,140 | A  | * | 10/2000 | Tanaka et al.   | ....... 365/185.17 |
| 6,891,755 | B2 | * | 5/2005  | Silvagni et al. | ....... 365/185.13 |
| 7,130,222 | B1 | * | 10/2006 | Ho et al.       | ....... 365/185.22 |
| 7,221,587 | B2 |   | 5/2007  | Yamashita et al. |                   |

* cited by examiner

*Primary Examiner*—Hoai V Ho
(74) *Attorney, Agent, or Firm*—Kenta Suzue; Haynes Beffel & Wolfeld LLP (57) ABSTRACT

Methods and apparatuses are disclosed for programming a page of nonvolatile memory cells across multiple nonvolatile memory cells accessed by multiple word lines.

21 Claims, 5 Drawing Sheets

METHOD AND APPARATUS FOR FAST PROGRAMMING OF MEMORY

BACKGROUND OF THE INVENTION

1. Field of the Invention

The invention relates to memory, and in particular to programming nonvolatile memory.

2. Description of Related Art

Nonvolatile memory, such as flash, charge trapping, nanocrystal, and programmable resistive memory, is accessed via word lines that apply a gate voltage to each memory cell. During a program operation, the word line voltage must be charged to have a magnitude sufficient to cause charge movement to or from the charge storage structure of the memory cell. When the word line voltage has been charged to a programming voltage, then bit lines corresponding to the memory cells to be programmed cause programming of those memory cells. To perform program verify, the word line voltage is set to the program verify voltage, and the values of the programmed memory cells are verified.

Nonvolatile memory arrays with a long word line with a relatively large capacitance suffer a correspondingly long latency as the word line voltage is charged and discharged to its appropriate program or program verify voltage. In addition to this latency, or word line transient time, the acts of programming and program verifying the memory cells accessed by the word line also take a relatively long time, due to the number of memory cells accessed by the long word line.

Therefore, it would be desirable to decrease the time of programming nonvolatile memory.

SUMMARY OF THE INVENTION

One aspect of the technology is a method of programming a nonvolatile memory integrated circuit.

Responsive to the nonvolatile memory integrated circuit receiving an instruction to program a group of nonvolatile memory cells, the nonvolatile memory integrated circuit performs:

programming, via a first word line, a first part of the memory cells; and programming, via a second word line, a second part of the memory cells, at least partly during changing a word line voltage of the first word line from a first voltage to a second voltage In various embodiments, the number of parts in which the group is divided is two, three, four, or more. If the group is divided into three or more parts, then the steps of this aspect refer to two of those three or more parts.

If the group is divided into two parts, then the first part and the second part are each about one half of a buffer memory size. If the group is divided into three parts, then the first part and the second part are each about one third of the buffer memory size. Generally, if the group is divided into N parts, then the first part and the second part are each about one Nth of the buffer memory size One of the embodiments includes, charging the second word line to a program voltage, at least partly during programming via the first word line.

One of the embodiments includes, allowing a program voltage accessed by the first word line to transiently change to a program verify voltage, at least partly during programming via the second word line.

One of the embodiments includes, program verifying, via the first word line, the first part of the group, and, program verifying, via the second word line, the second part of the group of nonvolatile memory cells. Another embodiment includes, in response to a failure of program verifying via the first word line, repeating at least programming via the first word line and program verifying via the first word line. Another embodiment includes, in response to a failure of said program verifying via the second word line, repeating at least programming via the second word line and program verifying via the second word line. Another embodiment includes, in response to a failure in one or both of program verifying via the first word line and program verifying via the second word line, repeating at least: programming via the first word line, programming via the second word line, program verifying via the first word line, and program verifying via the second word line.

One of the embodiments includes, prior to programming via the first word line, receiving data to the buffer memory.

Another aspect of the technology is a nonvolatile memory integrated circuit, which includes a nonvolatile memory array, a group of word lines accessing the nonvolatile memory array, and logic. The logic is responsive to receipt by the nonvolatile memory integrated circuit of a program instruction to program a group of memory cells on the nonvolatile memory array. The logic performs:

programming, via at least two word lines of the group of word lines.

One of the embodiments includes the logic programming about one half of the buffer memory size via a first word line of the group of word lines and programming about one half of the buffer memory size via a second word line of the group of word lines.

One of the embodiments includes the logic performing, at least partly during programming via a first word line of those at least two word lines, charging a second word line of those at least two word lines to a program voltage.

One of the embodiments includes the logic allowing a program voltage on a first word line of those at least two word lines to fall to a program verify voltage, at least partly during programming via a second word line of those at least two word lines.

One of the embodiments includes a buffer receiving data to be programmed via the program instruction.

Another aspect of the technology is a nonvolatile memory integrated circuit, which includes a nonvolatile memory array, a group of word lines accessing the nonvolatile memory array, and logic. The logic is responsive to receipt by the nonvolatile memory integrated circuit of a program instruction to program a group of memory cells on the nonvolatile memory array. The logic performs:

programming, via at least two word lines of the plurality of word lines, nonvolatile memory cells of the group of word lines.

One of the embodiments includes the logic performing the programming by programming about one half of the buffer memory size via a first word line of the group of word lines and programming about one half of the buffer memory size via a second word line of the group of word lines.

One of the embodiments includes a buffer receiving data to be programmed via the program instruction.

DETAILED DESCRIPTION

Figure 1:
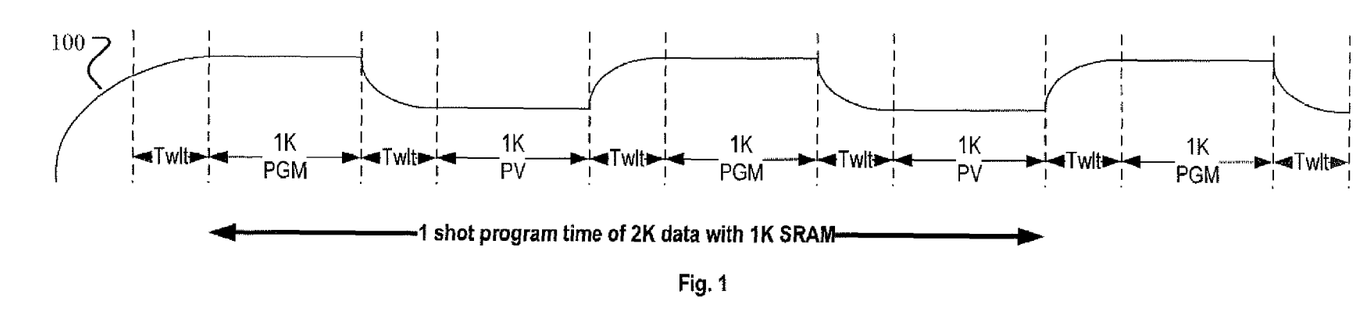
FIG. 1 is a voltage trace of word line voltage versus programming time of 2K of 1 page of data with 1K of SRAM.

FIG. 1 is a voltage trace of word line voltage versus programming time of 2K of 1 page of data with 1K of SRAM. In trace 100, the voltage of a word line is shown as a function of programming time. After the initial rise from ground voltage, the trace repeats several cycles of PGM (program) and PV (program verify), regularly interrupted by Twlt (word line transient time). The shown voltage trace characterizes a nonvolatile memory integrated circuit with a 1K SRAM. As a result, each PGM operation and each PV operation is performed on 1K of nonvolatile memory cells at a time. Because the program instruction in this case involves 2K of data— twice as large as the 1K SRAM—2 complete cycles of PGM and PV operations are required to program a complete 2K page of data.

Figure 2:
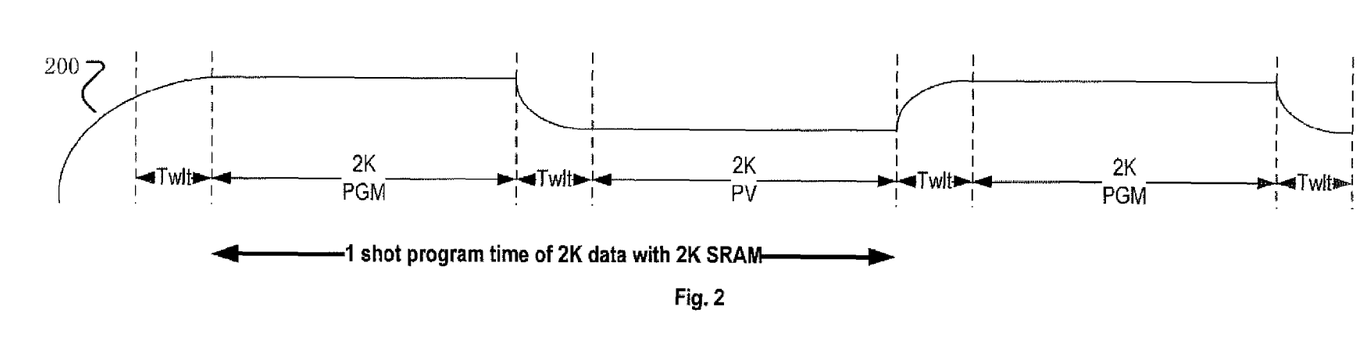
FIG. 2 is a voltage trace of word line voltage versus programming time of 2K of 1 page of data with 2K of SRAM.

FIG. 2 is a voltage trace of word line voltage versus programming time of 2K of 1 page data with 2K of SRAM. Compared to the nonvolatile memory integrated circuit characterized by the voltage trace 100 of FIG. 1 with a 1K SRAM, the nonvolatile memory integrated circuit characterized by the voltage trace 200 of FIG. 2 has a 2K SRAM. Because the SRAM is sufficiently large to hold an entire 2K page of data, only 1 complete cycle of PGM and PV operations is required to program 2K of data. Comparing FIGS. 1 and 2, the instruction to program 2K of data takes longer in FIG. 1 than in FIG. 2. If FIGS. 1 and 2 presented the only design considerations, then faster programming would dictate relatively large pages.

Figure 3:
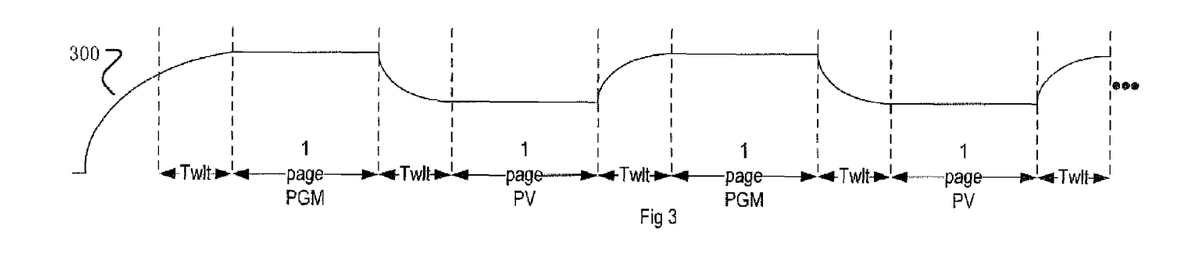
FIG. 3 is a voltage trace of word line voltage versus programming time of a page of data accessed by a single word line.

FIG. 3 is a voltage trace 300 of word line voltage versus programming time of a page of data accessed by a single word line. FIG. 3 resembles FIG. 2, except that the size of a single page of memory is unspecified, to emphasize that the technology is applicable regardless of the particular page size used in embodiments of a nonvolatile memory integrated circuit. Because an entire page is programmed in only cycle of PGM and PV operations, the SRAM has a capacity at least as large as a single page, or the number of memory cells accessed by a single word line.

Figure 4:
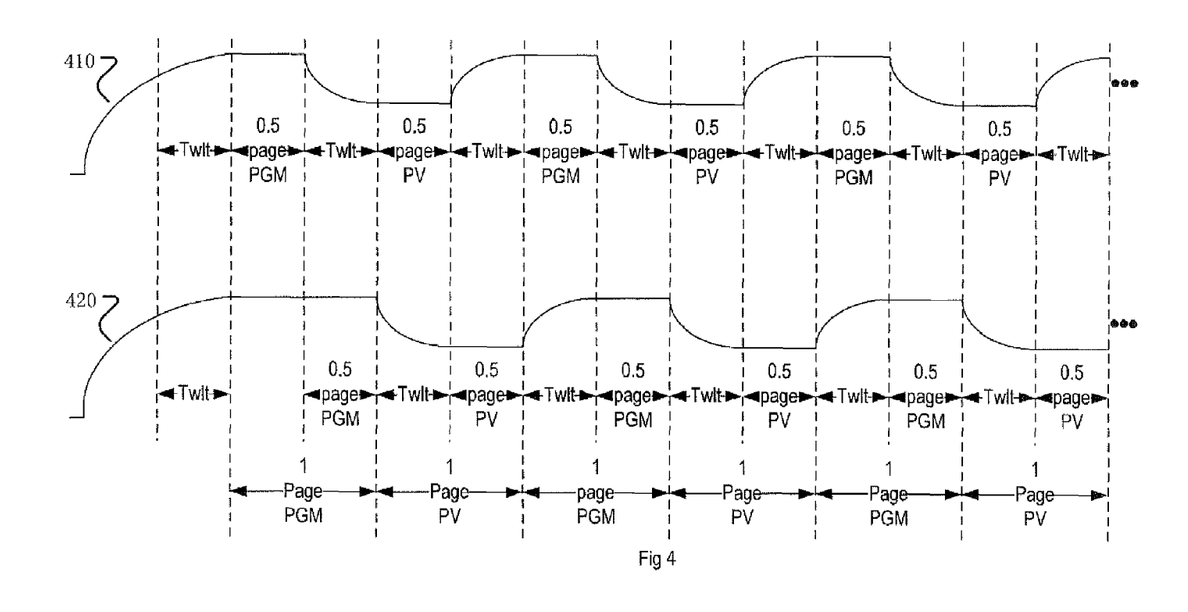
FIG. 4 is two voltage traces of word line voltage versus programming time of a page of data split into memory cells accessed by two word lines that are in different banks.

FIG. 4 is two voltage traces of word line voltage versus programming time of a page of data split into memory cells accessed by two word lines. Voltage trace 410 represents the voltage of a first word line accessing memory cells to program half of a memory page. Voltage trace 420 represents the voltage of a second word line accessing memory cells to program another half of the same memory page. The timings of voltage traces 410 and 420 are staggered with respect to each other. Voltage trace 410 completes a PGM operation before voltage trace 420 begins a PGM operation. Voltage trace 410 completes a PV operation before voltage trace 420 begins a PV operation. With the same 1 page buffer memory (SRAM) size, the program time in trace 300 includes a long PV time. However, the program time in traces 410 and 420 shorten the PV time, because the PV time is split between the multiple traces, and staggered with respect to each other.

A programming instruction to program a page of nonvolatile memory is faster for the nonvolatile memory integrated circuit characterized by the voltage traces 410 and 420, than for the nonvolatile memory integrated circuit characterized by the voltage trace 300. FIGS. 3 and 4 show that, during the duration that the nonvolatile memory integrated circuit of FIG. 3 has performed PGM and PV operations for 2 complete memory pages, the nonvolatile memory integrated circuit of FIG. 4 has performed PGM and PV operations for only 1 complete memory page and has not yet even started the PV operation of the second memory page. The nonvolatile memory integrated circuit of FIG. 4 is faster, because during the Twlt period of one word line, the other word line is performing a PGM or PV operation. In contrast, the nonvolatile memory integrated circuit of FIG. 3 is slower, because no PGM or PV operation occurs during a Twlt period.

Figure 5:
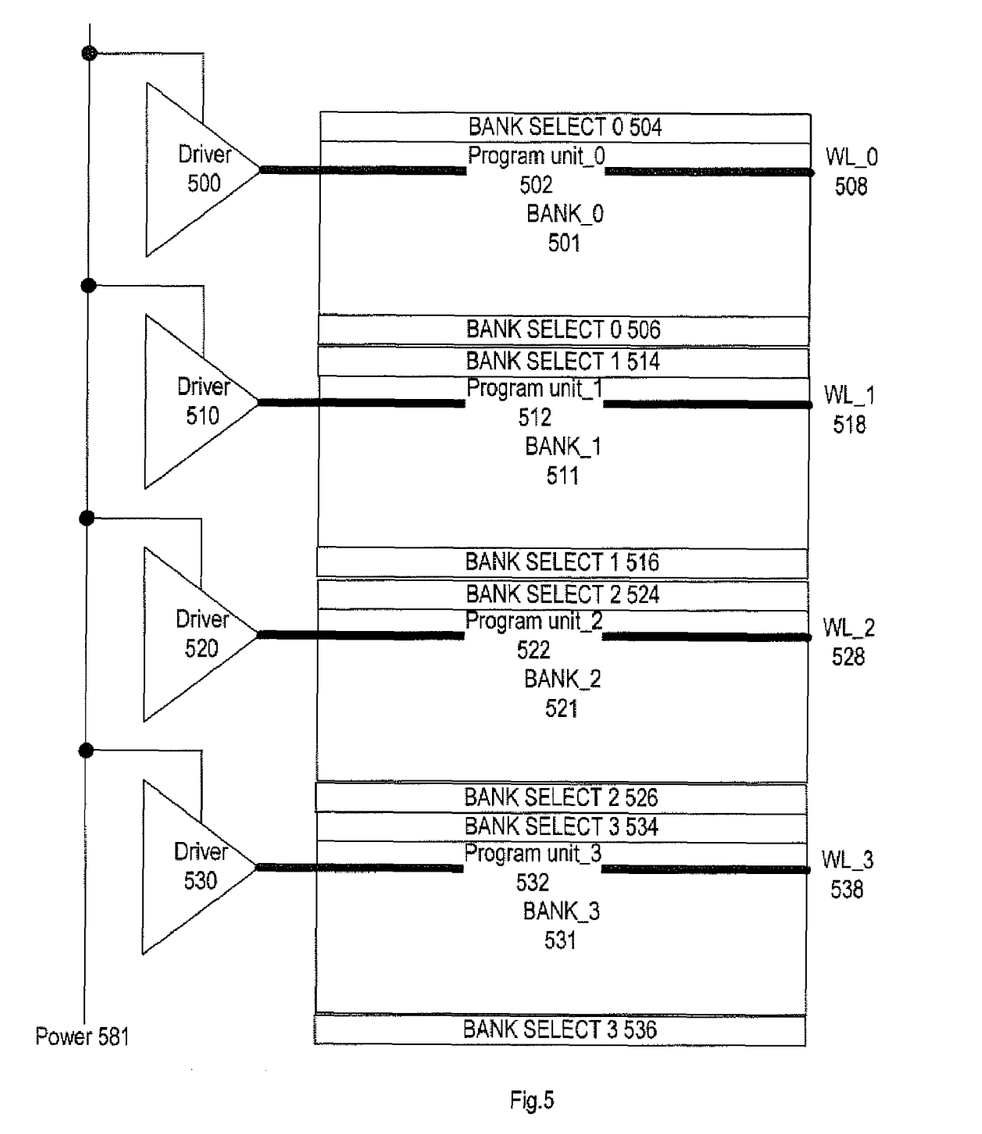
FIG. 5 is a block diagram of a memory array and word line drivers for a memory architecture with a page (unit) of data accessed by a single word line.

FIG. 5 is a block diagram of a memory array and word line drivers for a memory architecture with a page of data accessed by a single word line. A single power tree 581 supplies power to word line drivers 500, 510, 520, and 530, respectively controlling the voltage of world lines WL_0 508, WL_1 518, WL_2 528, and WL_3 538. The memory array is organized into multiple memory banks, BANK_0 501, BANK_1 511, BANK_2 521, and BANK_3 531. Because the memory architecture of FIG. 5 has a memory page that is coextensive with a memory bank, Program unit_0 502 is coextensive with BANK_0 501, Program unit_1 512 is coextensive with BANK_1 511, Program unit_2 522 is coextensive with BANK_2 521, and Program unit_3 532 is coextensive with BANK_3 531. Columns of memory cells are selected in BANK_0 501 by the circuitry of BANK SELECT 0 504 and BANK SELECT 0 506, BANK_1 511 by the circuitry of BANK SELECT 1 514 and BANK SELECT 1 516, BANK_2 521 by the circuitry of BANK SELECT 2 524 and BANK SELECT 2 526, and BANK_3 531 by the circuitry of BANK SELECT 3 534 and BANK SELECT 3 536.

Figure 6:
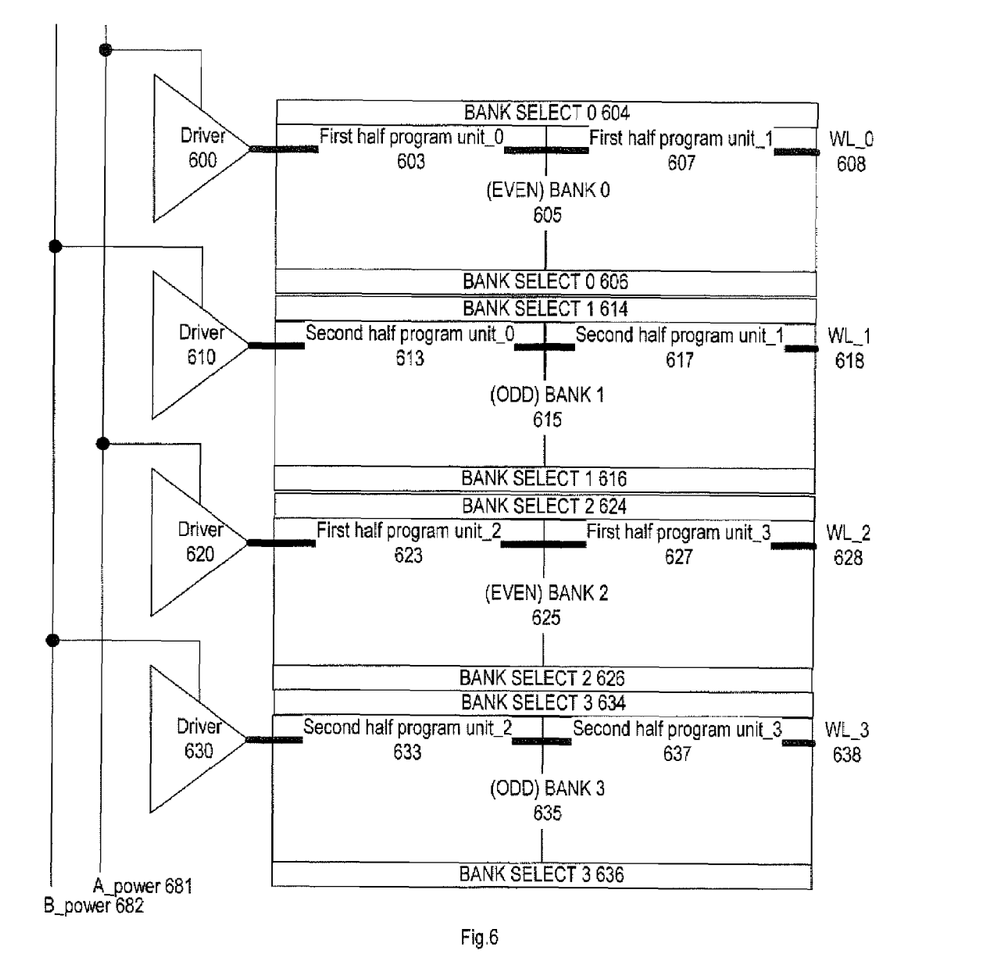
FIG. 6 is a block diagram of a memory array and word line drivers for a memory architecture with a page (unit) of data split into memory cells accessed by two words lines that are in different banks.

FIG. 6 is a block diagram of a memory array and word line drivers for a memory architecture with a page of data split into memory cells accessed by two words lines that are in different banks. Two power trees 681 and 682 supply power to the word line drivers. In particular, A_power 681 supplies power to word line drivers 600 and 620 respectively controlling the voltage of world lines WL_0 608 and WL_2 628. Also, B_power 682 supplied power to word line drivers 610 and 630 respectively controlling the voltage of world lines WL_1 618 and WL_3 638. Multiple power trees exist, to accommodate multiple ongoing programming procedures, as shown in voltage traces 410 and 420 of FIG. 4, The memory array is organized into multiple memory banks as in FIG. 6, except that each memory word line is split into two half banks. WL 0 is split into half pages 603 and 607 in BANK 0 605, WL_1 is split into half pages 613 and 617 in BANK 1 615, WL 2 is split into half pages 623 and 627 in BANK 2 625, and WL 3 is split into half pages 633 and 637 in BANK 3 635. In the memory architecture of FIG. 6, a memory page is no longer coextensive with a memory bank. Each memory page is split into two half pages located on different word lines, and each half page is coextensive with a half bank. Program unit_0 is split into First half program unit_0 603 and Second half program unit_0 613, respectively coextensive with BANK 0 605 and BANK 1 615. Program unit_1 is split into First half program unit_1 607 and Second half program unit_1 617, respectively coextensive with BANK 0 605 and BANK 1 615.

Program unit_2 is split into First half program unit_2 623 and Second half program unit_2 633, respectively coextensive with BANK 2 625 and BANK 3 635. Program unit_3 is split into First half program unit_3 627 and Second half program unit_3 637, respectively coextensive with BANK 2 625 and BANK 3 635.

Figure 7:
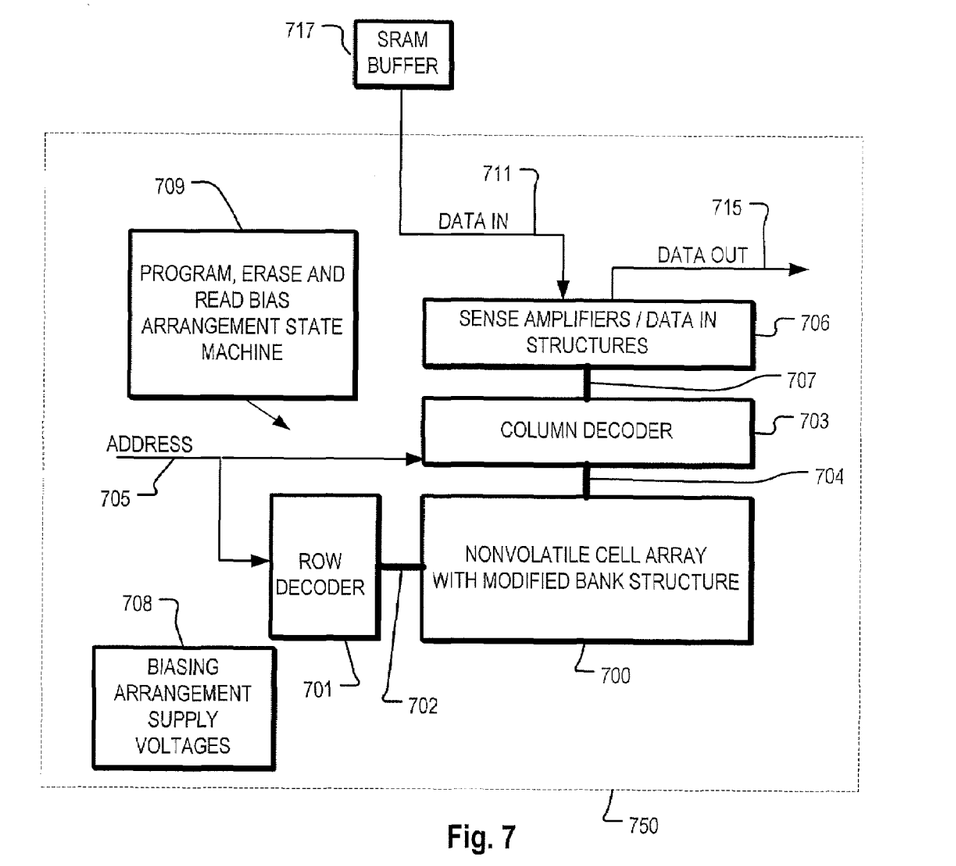
FIG. 7 is a block diagram of an exemplary nonvolatile memory integrated circuit with a memory array having a page of data split into memory cells accessed y multiple word lines.

FIG. 7 is a block diagram of an exemplary nonvolatile memory integrated circuit with a memory array having a page of data split into memory cells accessed by multiple word lines. The integrated circuit 750 includes a memory array 700 with the modified memory bank structure as disclosed herein, on a semiconductor substrate. A row decoder 701 is coupled to a plurality of word lines 702 arranged along rows in the memory array 700. The multiple power tree structure controlling the word lines is not shown, although present in some embodiments. A column decoder 703 is coupled to a plurality of bit lines 704 arranged along columns in the memory array 700. Addresses are supplied on bus 705 to column decoder 703 and row decoder 701. Sense amplifiers and data-in structures in block 706 are coupled to the column decoder 703 via data bus 707. Data is supplied via the data-in line 711 from input/output ports on the integrated circuit 750, or from other data sources internal or external to the integrated circuit 750, to the data-in structures in block 706. In the figure, data is supplied from a buffer 717. Data is supplied via the data-out line 715 from the sense amplifiers in block 706 to input/output ports on the integrated circuit 750, or to other data destinations internal or external to the integrated circuit 750. A bias arrangement state machine 709 controls the application of bias arrangement supply voltages 708, such as for the erase verify and program verify voltages, and the arrangements for programming, erasing, and reading the memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory having a plurality of memory cells, comprising:
   programming, via a first word line, a first part of the memory cells; and
   programming, via a second word line, a second part of the memory cells at least partly during changing a word line voltage of the first word line from a first voltage to a second voltage;
   verifying, via the first word line, the first part of the memory cells after the programming of the first part and the second part of the memory cells; and
   verifying, via the second word line, the second part of the memory cells, at least partly during changing the word line voltage of the first word line from the second voltage to the first voltage.

2. The method of claim 1, wherein the first part and the second part are each about one half of the number of memory cells accessed by the single word line.

3. The method of claim 1, the memory integrated circuit further performing:
   charging the second word line to a program voltage, at least partly during said programming via the first word line.

4. The method of claim 1, the memory integrated circuit further performing:
   allowing a program voltage accessed by the first word line to transiently change to a program verify voltage, at least partly during said programming via the second word line.

5. The method of claim 1, the memory integrated circuit further performing:
   in response to a failure of said verifying via the first word line, repeating at least:
   said programming via the first word line; and
   said verifying via the first word line.

6. The method of claim 1, the memory integrated circuit further performing:
   in response to a failure of said verifying via the second word line, repeating at least:
   said programming via the second word line; and
   said verifying via the second word line.

7. The method of claim 1, the memory integrated circuit further performing:
   in response to a failure in one or more of said verifying via the first word line and said verifying via the second word line, repeating at least:
   said programming via the first word line;
   said programming via the second word line;
   said program verifying via the first word line; and
   said program verifying via the second word line 8. The method of claim 1, the memory integrated circuit further performing:
   prior to said programming via the first word line, the memory integrated circuit:
   receiving data to be programmed in the first part of the plurality of memory cells; and then
   buffering the received data in a buffer having a first capacity less than a second capacity of the number of memory cells accessed by the single word line.

9. The method of claim 1, the memory integrated circuit further performing:
   prior said programming via the second word line, the memory integrated circuit:
   receiving data to be programmed in the second part of the plurality of memory cells; and then
   buffering the received data in a buffer having a first capacity less than a second capacity of the number of memory cells accessed by the single word line.

10. A method of operating a memory integrated circuit having a plurality of memory cells, comprising:
    responsive to the memory integrated circuit receiving an instruction to program the plurality of memory cells, the memory integrated circuit performing the following:
    programming, via a first word line, a first part of the plurality of nonvolatile memory cells; and
    programming, via a second word line, a second part of the plurality of memory cells;
    verifying, via the first word line, the first part of the memory cells after the programming of the first part and the second part of the memory cells: and
    verifying, via the second word line, the second part of the memory cells, at least partly during changing the word line voltage of the first word line from a second voltage to a first voltage.

11. The method of claim 10, wherein the first part and the second part are each about one half of a number of memory cells accessed by a single word line.

12. The method of claim 10, the memory integrated circuit further performing:
    charging the second word line to a program voltage, at least partly during said programming via the first word line.

13. The method of claim 10, the memory integrated circuit further performing:
- allowing a program voltage on the first word line to fall to a program verify voltage, at least partly during said programming via the second word line.

14. A memory integrated circuit, comprising:
- a memory array; and
- a plurality of word lines accessing the memory array; and
- logic responsive to receipt by the memory integrated circuit of a program instruction to program a plurality of memory cells on the memory array, by performing;
  - programming, via at least a first word line and a second word line of the plurality of word lines, the plurality of memory cells accessed by the first word line and the second word line of the plurality of word lines;
  - verifying, via the first word line, the first part of the plurality of memory cells after the programming of the first part and the second part of the plurality of memory cells; and
  - verifying, via the second word line, the second part of the plurality of memory cells, at least partly during changing a word line voltage of the first word line from a second voltage to a first voltage.

15. The integrated circuit of claim 14, wherein the logic performs said programming by performing:
- programming about one half of the number of memory cells accessed by the single word line via a first word line of the plurality of word lines and programming about one half of the number of memory cells accessed by the single word line via a second word line of the plurality of word lines.

16. The integrated circuit of claim 14, wherein the logic further performs:
- at least partly during said programming via a first word line of said at least two word lines, charging a second word line of said at least two word lines to a program voltage.

17. The integrated circuit of claim 14, wherein the logic further performs:
- allowing a program voltage on a first word line of said at least two word lines to fall to a program verify voltage, at least partly during said programming via a second word line of said at least two word lines.

18. The integrated circuit of claim 14, further comprising:
- a buffer receiving data to be programmed via the program instruction, the buffer having a first capacity less than a second capacity of the number of memory cells accessed by the single word line.

19. A memory integrated circuit, comprising:
- a memory array; and
- a plurality of word lines accessing the memory array; and
- logic responsive to receipt by the memory integrated circuit of a program instruction to program a plurality of memory cells on the memory array, by performing:
  - programming, via at least a first word line and a second word line of the plurality of word lines, the plurality of memory cells;
  - verifying, via the first word line, the first part of the plurality of memory cells after the programming of the first part and the second part of the plurality of memory cells; and
  - verifying, via the second word line, the second part of the plurality of memory cells, at least partly during changing a word line voltage of the first word line from a second voltage to a first voltage.

20. The integrated circuit of claim 19, wherein the logic performs said programming by performing:
- programming about one half of the number of memory cells accessed by a single word line via a first word line of the plurality of word lines and programming about one half of the number of memory cells accessed by the single word line via a second word line of the plurality of word lines.

21. integrated circuit of claim 19, further comprising:
- a buffer receiving data to be programmed via the program instruction, the buffer having a first capacity less than a second capacity of a number of memory cells accessed by a single word line.

* * * * *

UNITED STATES PATENT AND TRADEMARK OFFICE
CERTIFICATE OF CORRECTION

PATENT NO. : 7,453,734 B2  Page 1 of 1
APPLICATION NO. : 11/555620
DATED : November 18, 2008
INVENTOR(S) : Chen et al.

It is certified that error appears in the above-identified patent and that said Letters Patent is hereby corrected as shown below:

Column 6, line 51, delete "nonvolatile".
Column 7, line 11, delete ";" and insert -- : --.

Signed and Sealed this

Twentieth Day of April, 2010

David J. Kappos
*Director of the United States Patent and Trademark Office*